United States Patent
Kim et al.

(10) Patent No.: US 11,576,284 B2
(45) Date of Patent: *Feb. 7, 2023

(54) COOLANT SUPPLYING MODULE

(71) Applicants: Hyundai Motor Company, Seoul (KR); Kia Motors Corporation, Seoul (KR)

(72) Inventors: Yeon Ho Kim, Seoul (KR); Wan Je Cho, Hwaseong-Si (KR); Jeawan Kim, Gwangmyeong-Si (KR); Jae Yeon Kim, Hwaseong-Si (KR); Su Whan Kim, Hwaseong-Si (KR)

(73) Assignees: Morgan, Lewis & Bockius LLP, San Francisco, CA (US); Kia Motors Corporation, Seoul (KR)

( * ) Notice: Subject to any disclaimer, the term of this patent is extended or adjusted under 35 U.S.C. 154(b) by 181 days.

This patent is subject to a terminal disclaimer.

(21) Appl. No.: 16/851,621

(22) Filed: Apr. 17, 2020

(65) Prior Publication Data

US 2021/0219466 A1 Jul. 15, 2021

(30) Foreign Application Priority Data

Jan. 13, 2020 (KR) .................... 10-2020-0004012

(51) Int. Cl.
*H05K 7/20* (2006.01)
*B60L 58/26* (2019.01)
*H01M 10/6568* (2014.01)
*H01M 10/625* (2014.01)
*H01M 10/613* (2014.01)

(52) U.S. Cl.
CPC .......... *H05K 7/20872* (2013.01); *B60L 58/26* (2019.02); *H01M 10/613* (2015.04); *H01M 10/625* (2015.04); *H01M 10/6568* (2015.04); *H05K 7/20263* (2013.01); *H05K 7/20272* (2013.01); *H01M 2220/20* (2013.01)

(58) Field of Classification Search
CPC .......... H05K 7/20872; H05K 7/20263; H05K 7/20272; H01M 10/613; H01M 10/625; H01M 10/6568; H01M 2220/20; B60L 58/26
USPC ........................................................ 165/80.4
See application file for complete search history.

(56) References Cited

U.S. PATENT DOCUMENTS

| 6,364,213 | B1 * | 4/2002 | Baltz | F01P 7/16 |
| | | | | 123/41.01 |
| 7,395,787 | B1 * | 7/2008 | Claypole | F01P 11/04 |
| | | | | 123/142.5 E |

(Continued)

FOREIGN PATENT DOCUMENTS

KR 10-2019-0019178 A 2/2019

*Primary Examiner* — Tho V Duong
*Assistant Examiner* — Raheena R Malik
(74) *Attorney, Agent, or Firm* — Morgan, Lewis & Bockius LLP (57) ABSTRACT

A coolant supplying module for supplying a coolant stored in a shared reservoir tank to an electrical component cooling circuit and a battery cooling circuit includes a main body connected to the shared reservoir tank, at least one water pump mounting portion formed at the main body to mount at least one water pump included in the electrical component cooling circuit and the battery cooling circuit, and a valve mounting portion formed at the main body to mount a coolant valve included in the battery cooling circuit.

17 Claims, 6 Drawing Sheets

(56) References Cited

U.S. PATENT DOCUMENTS

| | | | |
|---|---|---|---|
| 8,459,389 B2* | 6/2013 | Myers | F01P 11/08 |
| | | | 180/68.4 |
| 10,391,854 B1* | 8/2019 | Keller | B60K 1/00 |
| 2007/0044938 A1* | 3/2007 | Farley | B60K 11/02 |
| | | | 165/41 |
| 2017/0373359 A1* | 12/2017 | Krull | H01M 10/63 |

* cited by examiner

COOLANT SUPPLYING MODULE

CROSS-REFERENCE TO RELATED APPLICATION

The present application claims priority to Korean Patent Application No. 10-2020-0004012 filed on Jan. 13, 2020, the entire contents of which is incorporated herein for all purposes by this reference.

BACKGROUND OF THE INVENTION

Field of the Invention

The present invention relates to a coolant supplying module.

Description of Related Art

Nowadays, while interest in energy efficiency and an environment pollution problem increases, development of an environment-friendly vehicle that can substantially replace an internal combustion engine vehicle is requested. The environment-friendly vehicle is classified into an electric vehicle which is driven using a fuel cell or electricity as a power source and a hybrid vehicle which is driven using an engine and an electric battery.

Here, an electric vehicle that utilizes a fuel cell converts chemical reaction energy of oxygen and hydrogen to electrical energy to occur a driving torque, and in the present process, thermal energy occurs by a chemical reaction within the fuel cell and it is essential in securing a performance of the fuel cell to effectively remove a generated heat.

Furthermore, a hybrid vehicle generates a driving torque by driving a motor using electricity which is supplied from an electric battery or the fuel cell together with an engine operating with general fuel, and when effectively removing a heat occurring in a fuel cell, a battery, and a motor, a performance of the motor may be secured.

Such a hybrid vehicle is driven in an EV mode which is driven by a motor upon constant speed driving, gentle driving, and low and medium constant speed driving, upon acceleration and rapid acceleration, an internal combustion engine and a motor are simultaneously driven, and upon high constant speed driving, a motor is stopped and the hybrid vehicle is operated by the internal combustion engine.

Accordingly, in a hybrid vehicle, an engine cooling means for circulating and cooling coolant in an engine and an electrical equipment cooling means for circulating and cooling coolant in an electric power component including a motor are each provided.

However, in such a conventional hybrid vehicle, as an engine cooling circuit and an electronics cooling circuit are each configured with a separate close and seal circuit. Accordingly, as two reservoir tanks used to each cooling circuit may be provided, they are difficult to be mounted in a narrow engine compartment, and a manufacturing cost is increased due to the increasing of the constituent elements.

Also, the weight is increased due to the increasing of the constituent elements and productivity may deteriorate by the increasing of a mounting time of each reservoir tank.

The information included in this Background of the present invention section is only for enhancement of understanding of the general background of the present invention and may not be taken as an acknowledgement or any form of suggestion that this information forms the prior art already known to a person skilled in the art.

BRIEF SUMMARY

Various aspects of the present invention are directed to providing a coolant supplying module having advantages of supplying a coolant from a shared reservoir tank to both an electrical component cooling circuit and a battery cooling circuit.

An exemplary coolant supplying module is for supplying a coolant stored in a shared reservoir tank to an electrical component cooling circuit and a battery cooling circuit, and includes a main body connected to the shared reservoir tank, at least one water pump mounting portion formed at the main body to mount at least one water pump included in the electrical component cooling circuit and the battery cooling circuit, and a valve mounting portion formed at the main body to mount a coolant valve included in the battery cooling circuit.

A connection port may be formed in an upper portion of the main body such that the connection port is directly connected to the shared reservoir tank.

The at least one water pump mounting portion may include a first water pump mounting portion mounting a first water pump included in the electrical component cooling circuit, and a second water pump mounting portion mounting a second water pump included the battery cooling circuit.

The first water pump mounting portion and the second water pump mounting portion may be formed perpendicular to each other.

A chiller connecting portion formed at the main body to connect a chiller for exchanging heat between the coolant of the shared reservoir tank with a refrigerant may be further included.

The chiller connecting portion may be formed at a position opposite to the first water pump mounting portion.

The main body may further include at least one barrier wall to distribute the coolant flowing into the main body depending on whether the electrical component cooling circuit and the battery cooling circuit are to be separately cooled or integrally cooled.

The at least one barrier wall may include a first barrier wall formed at a position in the vicinity of the first water pump mounting portion and extending from the connection port toward the valve mounting portion, a second barrier wall formed at a position facing the second water pump mounting portion and extending from the valve mounting portion toward the connection port, a third barrier wall formed at a position apart from the chiller connecting portion toward the first water pump mounting portion and extending from an internal lower portion of the main body toward an internal upper portion of the main body in the main body, and a fourth barrier wall formed at a position between the second barrier wall and the third barrier wall and extending from the internal upper portion toward the internal lower portion of the main body in the main body.

When the coolant flows from the valve mounting portion into the main body by an operational control of the coolant valve mounted at the valve mounting portion, the second barrier wall may minimize an amount of the inflow coolant flowing toward the second water pump mounting portion.

The third and fourth barrier walls may minimize an amount of coolant inflowing from the chiller connecting portion to flow toward the first water pump mounting portion.

The valve mounting portion may include an intake port separately formed from the main body, a first outlet communicating with an interior of the main body so that the valve mounting portion and the main body fluidically-communicate with each other, and a second outlet separately formed from the main body.

When separately cooling the electrical component and the battery, the coolant flowing from the shared reservoir tank into the main body may flow to the first water pump mounting portion by the operation of the first water pump, and is supplied to the electrical component cooling circuit. Furthermore, the coolant flowing from the chiller connecting portion into the main body may flow to the second water pump mounting portion by the operation of the second water pump, and is supplied to the battery cooling circuit.

When separately cooling the electrical component and the battery, the first and second water pumps may rotate at a same rotation speed or the second water pump may rotate at a higher rotation speed than the first water pump.

When integrally cooling the electrical component and the battery, the coolant flowing from the shared reservoir tank into the main body mostly may flow to the second water pump mounting portion by the operation of the second water pump, and is supplied to the battery cooling circuit. Furthermore, a partial coolant flowing from the shared reservoir tank into the main body and a coolant flowing from the valve mounting portion into the main body after passing through the battery cooling circuit may flow to the first water pump mounting portion by the operation of the first water pump, and is supplied to the electrical component cooling circuit.

The valve mounting portion may be formed at a lower portion of the main body.

The main body, the water pump mounting portion, the valve mounting portion, and the chiller connecting portion may be integrally formed.

The chiller connecting portion may be formed to allow a coolant to flow into and be exhausted from the chiller.

The chiller may be directly mounted to the chiller connecting portion.

According to a coolant supplying module according to an exemplary embodiment of the present invention, since the coolant is supplied from the shared reservoir tank to both the electrical component cooling circuit and the battery cooling circuit and various constituent elements are easily mounted, spatial utility of an engine compartment may be improved.

An exemplary coolant supplying module may directly mount the first and second water pumps for supplying the coolant to the electrical component cooling circuit and the battery cooling circuit and may be efficiently connected to connection pipes. Therefore, a layout of connection pipes may be simplified, and mountability and maintainability may be improved.

Furthermore, required number of separate portions realizing the layout of the connection pipes may be minimized, decreasing weight and cost, and improving productivity by reducing required assembly processes.

The methods and apparatuses of the present invention have other features and advantages which will be apparent from or are set forth in more detail in the accompanying drawings, which are incorporated herein, and the following Detailed Description, which together serve to explain certain principles of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

An example embodiment of the present invention will hereinafter be described in detail with reference to the accompanying drawings.

Exemplary embodiments disclosed in the present specification and the constructions depicted in the drawings are only the exemplary embodiments of the present invention, and do not cover the entire scope of the present invention. Therefore, it will be understood that there may be various equivalents and variations at the time of the application of the present specification.

To clarify the present invention, portions that are not connected to the description will be omitted, and the same elements or equivalents are referred to with the same reference numerals throughout the specification.

Also, the size and thickness of each element are arbitrarily shown in the drawings, but the present invention is not necessarily limited thereto, and in the drawings, the thickness of layers, films, panels, regions, etc., are exaggerated for clarity.

Furthermore, unless explicitly described to the contrary, the word "comprise" and variations such as "comprises" or "comprising", will be understood to imply the inclusion of stated elements but not the exclusion of any other elements.

Furthermore, each of terms, such as " . . . unit", " . . . means", " . . . part", and " . . . member" described in the specification, mean a unit of a comprehensive element that performs at least one function or operation.

Figure 1:
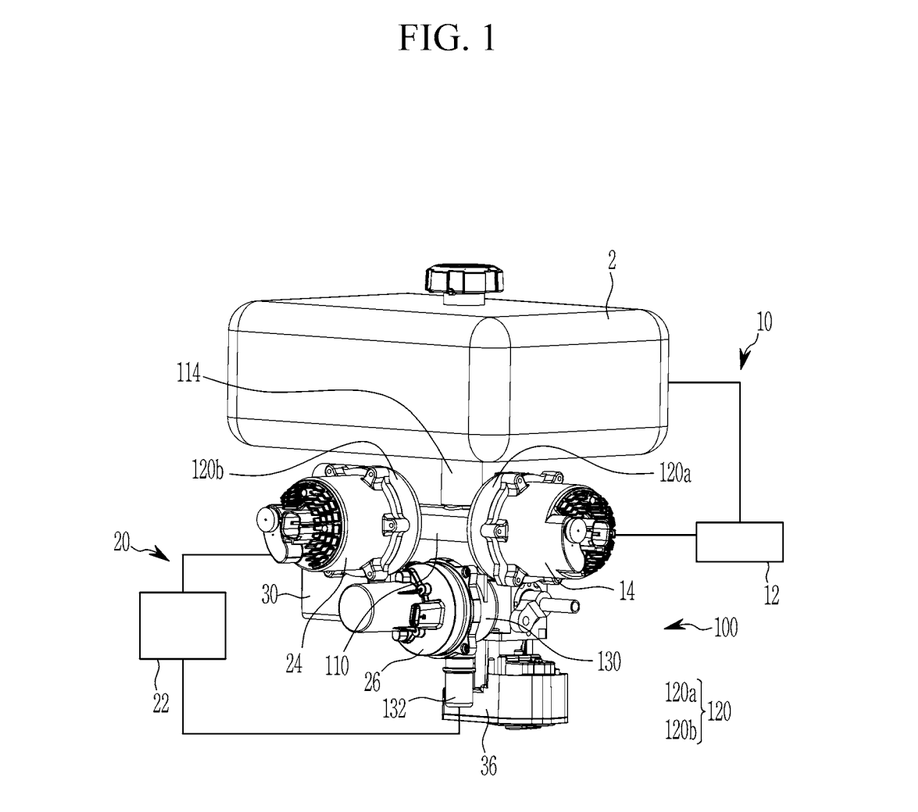
FIG. 1 is a perspective view of a coolant supplying module according to an exemplary embodiment of the present invention.
Figure 2:
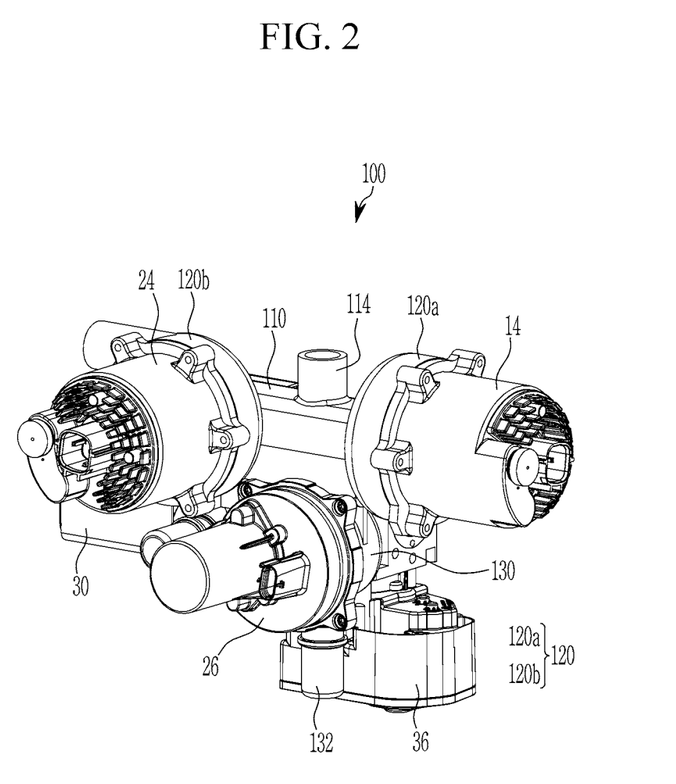
FIG. 2 is a perspective view of a main body mounted with constituent elements applied to a coolant supplying module according to an exemplary embodiment of the present invention.
Figure 3:
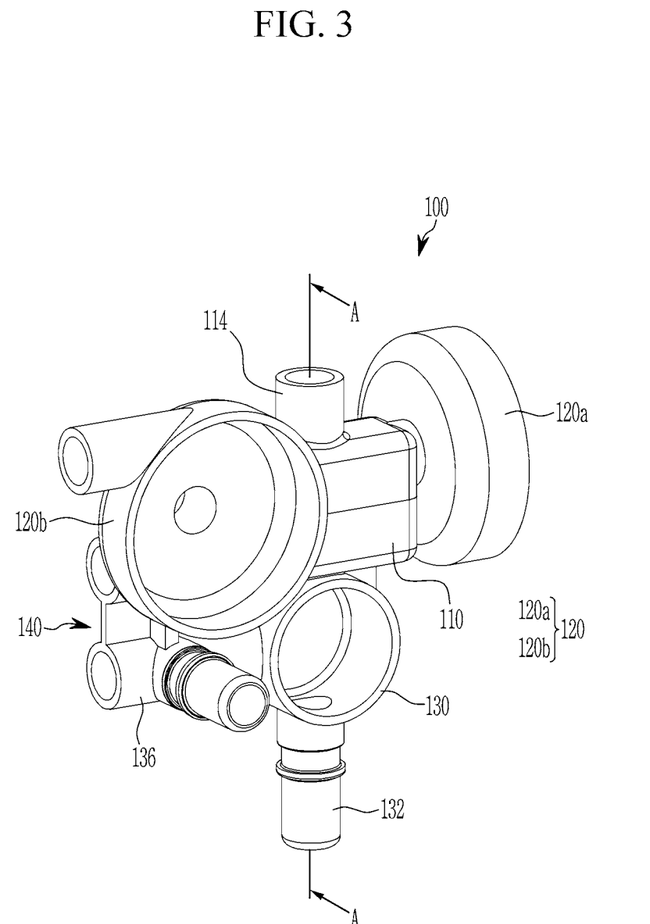
FIG. 3 is a perspective view of a main body applied to a coolant supplying module according to an exemplary embodiment of the present invention.
Figure 4:
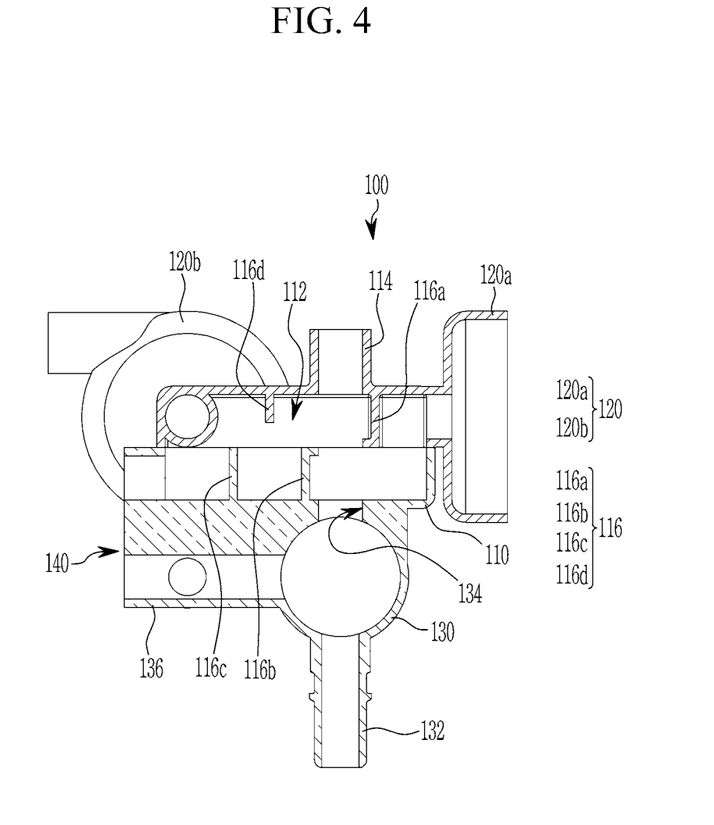
FIG. 4 is a cross-sectional view taken along line A-A of FIG. 3.

FIG. 1 is a perspective view of a coolant supplying module according to an exemplary embodiment of the present invention, FIG. 2 is a perspective view of a main body mounted with constituent elements applied to a coolant supplying module according to an exemplary embodiment of the present invention, FIG. 3 is a perspective view of a main body applied to a coolant supplying module according to an exemplary embodiment of the present invention, and FIG. 4 is a cross-sectional view taken along line A-A of FIG. 3.

Referring to the drawings, a coolant supplying module 100 according to an exemplary embodiment of the present invention may supply, a coolant stored in a shared reservoir tank 2 to an electrical component cooling circuit 10 for supplying a coolant to an electrical component 12, and the coolant to a battery cooling circuit 20 for supplying the coolant to a battery 22.

That is, the coolant supplying module 100 may supply the coolant stored in the shared reservoir tank 2 to both of the electrical component cooling circuit 10 and the battery cooling circuit 20.

As shown in FIG. 1 to FIG. 3, such a coolant supplying module 100 includes a main body 110, at least one at least one water pump mounting portion 120, a valve mounting portion 130, and a chiller connecting portion 140.

Here, the main body 110, the at least one water pump mounting portion 120, the valve mounting portion 130, and the chiller connecting portion 140 may be integrally formed.

In the exemplary embodiment of the present invention, the main body 110 is formed in a generally rectangular box shape, and is connected to the shared reservoir tank 2.

The main body 110 forms an internal space 112 that receives a coolant.

A connection port 114 is formed in an upper portion of the main body 110. The connection port 114 communicates with the internal space 112 and is directly connected to a lower portion of the shared reservoir tank 2.

The connection port 114 may protrude upwards from the main body 110.

In the exemplary embodiment of the present invention, the at least one water pump mounting portion 120 may be formed at the main body 110 such that water pumps included in the electrical component cooling circuit 10 and the battery cooling circuit 20 may be mounted.

The at least one water pump mounting portion 120 may include first and second water pump mounting portions 120a and 120b.

A first water pump 14 included in the electrical component cooling circuit 10 is mounted at the first water pump mounting portion 120a. The first water pump mounting portion 120a is formed at the main body 110.

A second water pump 24 included in the battery cooling circuit 20 is mounted at the second water pump mounting portion 120b. The second water pump mounting portion 120b is formed at the main body 110, at a different position from the first water pump mounting portion 120a.

The first water pump mounting portion 120a and the second water pump mounting portion 120b may be formed in perpendicular directions at the main body 110.

That is, by forming the first and second water pump mounting portions 120a and 120b in perpendicular directions, sizes and mounting locations of the first and second water pumps 14 and 24 may be optimized, and a layout of connection pipes for connection to the electrical component cooling circuit 10 and the battery cooling circuit 20 may also optimized.

In the exemplary embodiment of the present invention, the valve mounting portion 130 is formed at the main body 110 to mount a coolant valve 26 included in the battery cooling circuit 20. Such a valve mounting portion 130 may be mounted at a lower portion of the main body 110.

An intake port 132, a first outlet 134, and a second outlet 136 may be respectively formed at the valve mounting portion 130.

The intake port 132 is separately formed from the main body 110. The intake port 132 is connected to the battery cooling circuit 20 such that a coolant having passed through the battery 22 may flow into the intake port 132.

In the exemplary embodiment of the present invention, the first outlet 134 communicate with an interior of the main body 110 such that the valve mounting portion 130 and the main body 110 may communicate with each other.

The first outlet 134 may be disposed on a same axis with the intake port 132.

Furthermore, the second outlet 136 is separately formed from the main body 110. The second outlet 136 may be formed toward the second water pump mounting portion 120b and perpendicularly with the intake port 132.

The first and second outlets 134 and 136 may be opened or closed by the coolant valve 26 mounted at the valve mounting portion 130.

In the exemplary embodiment of the present invention, the chiller connecting portion 140 is formed at the main body 110, to connect a chiller 30 that heat-exchanges the coolant stored in the shared reservoir tank 2 with a refrigerant.

The chiller connecting portion 140 may be formed at a position opposite to the first water pump mounting portion 120a.

The chiller connecting portion 140 may be formed to allow coolant to flow into and be exhausted from the chiller 30.

The chiller 30 may be directly mounted to the chiller connecting portion 140.

The chiller 30 may be a water-cooled heat-exchanger which is connected to an air-conditioning apparatus and exchanges heat between a coolant and a refrigerant The chiller 30 may be mounted with a refrigerant temperature sensor 36, and the like.

In the exemplary embodiment of the present invention, as shown in FIG. 4, the main body 110 may further include at least one barrier wall 116 to distribute a coolant flow depending on whether the electrical component cooling circuit 10 and the battery cooling circuit 20 are to be separately cooled or integrally cooled.

The at least one barrier wall 116 may include a first barrier wall 116a, a second barrier wall 116b, a third barrier wall 116c, and a fourth barrier wall 116d that are formed at positions in the internal space 112 spaced from each other.

The first barrier wall 116a is formed at a position in the vicinity of the first water pump mounting portion 120a and extends from the connection port 114 toward the valve mounting portion 130.

The second barrier wall 116b is formed at a position facing the second water pump mounting portion 120b, and extends from the valve mounting portion 130 toward the connection port 114.

When the coolant flows from the valve mounting portion 130 into the main body 110 by an operational control of the coolant valve 26 mounted at the valve mounting portion 130, the second barrier wall 116b may minimize an amount of the inflow coolant flowing toward the second water pump mounting portion 120b.

The third barrier wall 116c is formed at a position apart from the chiller connecting portion 140 toward the first water pump mounting portion 120a, and extends from an internal lower portion toward an internal upper portion of the main body 110.

The fourth barrier wall 116d is formed at a position between the second barrier wall 116b and the third barrier wall 116c, and extends from the internal upper portion toward the internal lower portion of the main body 110.

The third and fourth barrier walls 116c and 116d may minimize the amount of coolant inflowing from the chiller connecting portion 140 to flow toward the first water pump mounting portion 120a.

One side end portions of the first, second, and third barrier walls 116a, 116b, and 116cs may be connected to a top or bottom surface of the internal space 112 of the main body 110.

Another side end portions of the first, second, and third barrier walls 116a, 116b, and 116cs may be positioned vertically central in the internal space 112 of the main body 110.

One side end portion of the fourth barrier wall 116d may be connected to the top portion of the internal space 112 of the main body 110, and another side end portion of the may be positioned at a position biased toward the top portion from a vertically central position of the internal space 112 of the main body 110.

An operation of a coolant supplying module 100 according to an exemplary embodiment of the present invention is hereinafter described in detail with reference to FIG. 5 and FIG. 6.

Figure 5:
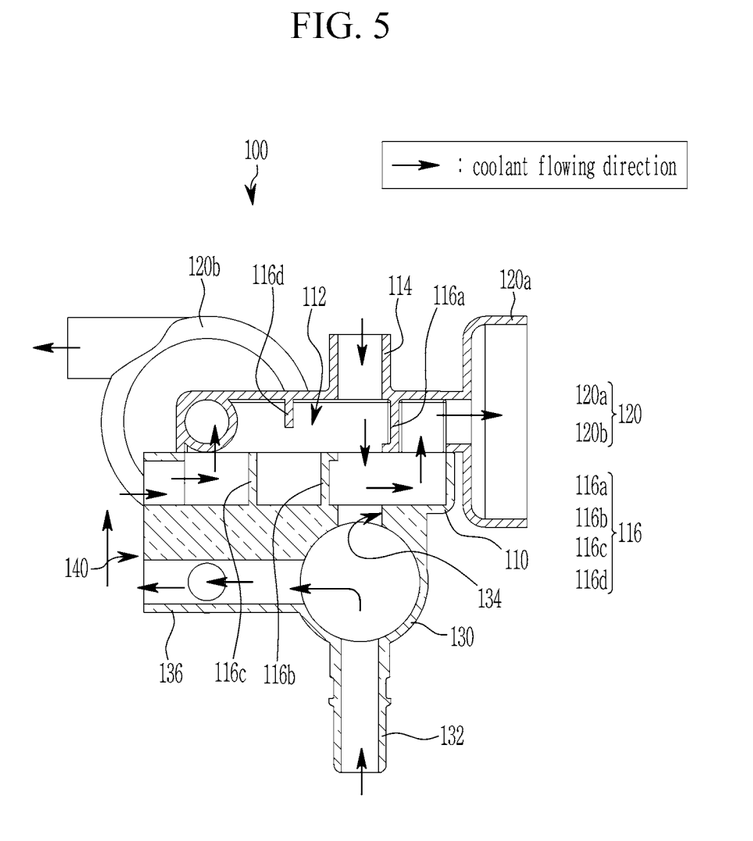
FIG. 5 illustrates an operation state of a coolant supplying module according to an exemplary embodiment when separately cooling an electrical component and a battery.
Figure 6:
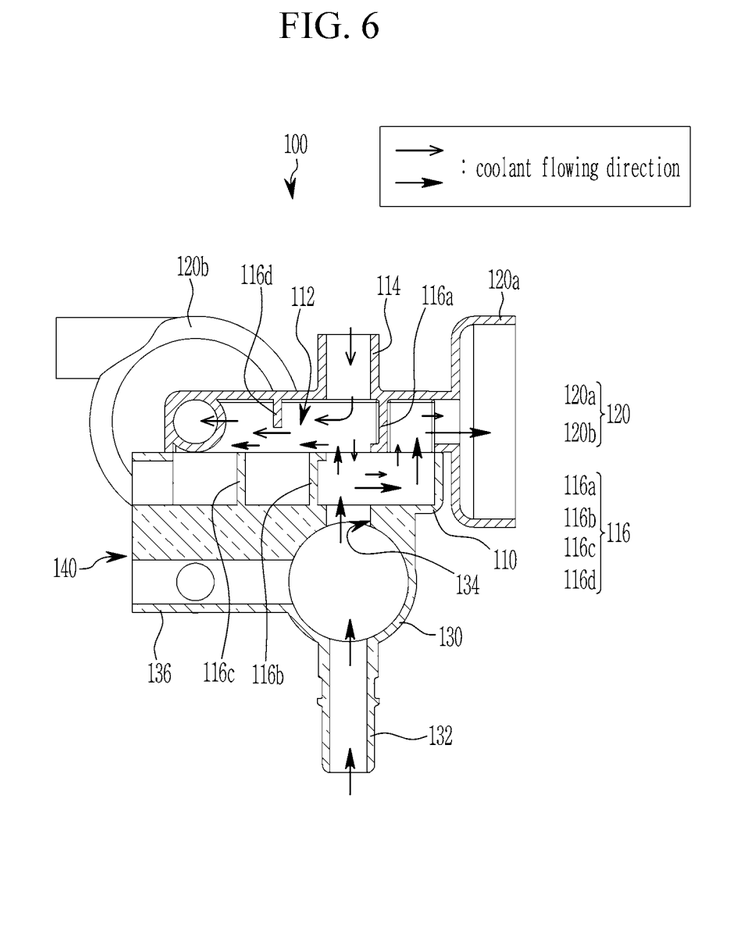
FIG. 6 illustrates an operation state of a coolant supplying module according to an exemplary embodiment when integrally cooling an electrical component and a battery.

FIG. 5 illustrates an operation state of a coolant supplying module according to an exemplary embodiment when separately cooling an electrical component and a battery, and FIG. 6 illustrates an operation state of a coolant supplying module according to an exemplary embodiment when integrally cooling an electrical component and a battery.

Firstly, separate cooling of the electrical component 12 and the battery 22 is described with reference to FIG. 5.

Referring to FIG. 5, the coolant flowing from the shared reservoir tank 2 into the main body 110 flows to the first water pump mounting portion 120a by the operation of the first water pump 14, and is supplied to the electrical component cooling circuit 10.

The coolant flowing from the chiller connecting portion 140 into the main body 110 flows to the second water pump mounting portion 120b by the operation of the second water pump 24, and may be supplied to the battery cooling circuit 20.

Here, the first and second water pumps 14 and 24 may be operated a same rotation speed. Alternatively, the second water pump 24 may be operated at a higher rotation speed than the first water pump 14.

That is, when the electrical component 12 and the battery 22 are to be separately cooled, the electrical component cooling circuit 10 and the battery cooling circuit 20 are separated by the operation of the coolant valve 26 mounted at the coolant supplying module 100.

Accordingly, the coolant stored in the shared reservoir tank 2 may circulate the electrical component cooling circuit 10 to cool the electrical component 12, separately from the coolant flowing from the battery cooling circuit 20 into the main body 110.

Furthermore, the coolant of the battery cooling circuit 20 passes through the chiller 30 and then flows into the main body 110, separately from the coolant flowing from the shared reservoir tank 2 into the main body 110.

That is, the coolant of the battery cooling circuit 20 flowing into the intake port 132 is exhausted through the second outlet 136 which is open by the operation of the coolant valve 26, and thereby is provided to the chiller 30.

Here, the first outlet 134 may be closed by the operation of the coolant valve 26.

Accordingly, the coolant of the battery cooling circuit 20 may pass through the chiller 30 to be cooled by a heat-exchange with a refrigerant supplied from an air-conditioning apparatus to the chiller 30, and the may flow into the main body 110, thereafter being exhausted through the second water pump mounting portion 120b.

The coolant exhausted through the second water pump mounting portion 120b may circulate the battery cooling circuit 20 to cool the battery 22.

That is, in the internal space 112 of the main body 110, the coolant may not flow through the internal space 112 at a position between the second and third barrier walls 116b and 116c and at the position of the fourth barrier wall 116d.

Integral cooling of the electrical component 12 and the battery 22 is described with reference to FIG. 6.

Referring to FIG. 6, the coolant flowing from the shared reservoir tank 2 into the main body 110 is mostly flows to the second water pump mounting portion 120b by the operation of the second water pump 24, and is supplied to the battery cooling circuit 20.

Accordingly, the coolant stored in the shared reservoir tank 2 mostly flows into the main body 110, and being exhausted through the second water pump mounting portion 120b, circulates the battery cooling circuit 20 to cool the battery 22.

Furthermore, a partial coolant flowing from the shared reservoir tank 2 and the coolant flowing from the valve mounting portion 130 into the main body 110 after passing through the battery cooling circuit 20 flow to the first water pump mounting portion 120a by the operation of the first water pump 13, and is supplied to the electrical component cooling circuit 10.

That is, the coolant flowing from the battery cooling circuit 20 into the intake port 132 is exhausted through the first outlet 134 which is open by the operation of the coolant valve 26, and flows into the internal space 112 of the main body 110.

Here, the second outlet 136 may be closed by the operation of the coolant valve 26.

Accordingly, the chiller 30 is not supplied with the coolant, the coolant flowing from the battery cooling circuit 20 into the internal space 112 together with the partial coolant flowing from the shared reservoir tank 2 into the main body 110 may circulate the electrical component cooling circuit 10 to cool the electrical component 12.

Meanwhile, a portion of the coolant flowing from the battery cooling circuit 20 into the main body 110 together with the coolant flowing from the shared reservoir tank 2 may flow to the second water pump mounting portion 120b.

That is, when integrally cooling the electrical component 12 and the battery 22, the electrical component cooling circuit 10 and the battery cooling circuit 20 may be connected to each other through the coolant supplying module 100 depending on the operation of the coolant valve 26.

Here, the coolant may not flow through the internal space 112 connected to the chiller connecting portion 140 and through the second outlet 136.

As described above, according to a coolant supplying module 100 according to an exemplary embodiment of the present invention, depending on whether the electrical component 12 and the battery 22 is to be separately cooled or integrally cooled, e.g., according to a driving mode of a vehicle, the electrical component cooling circuit 10 and the battery cooling circuit 20 may be selectively connectable or separated in circulating the coolant.

Furthermore, a single reservoir tank 2 may be shared by the electrical component cooling circuit 10 and the battery cooling circuit 20.

According to a coolant supplying module 100 according to an exemplary embodiment of the present invention, since the coolant is supplied from the shared reservoir tank 2 to both the electrical component cooling circuit 10 and the battery cooling circuit 20 and various constituent elements are easily mounted, spatial utility of an engine compartment may be improved.

The exemplary coolant supplying module may directly mount the first and second water pumps 14 and 24 for supplying the coolant to the electrical component cooling circuit 10 and the battery cooling circuit 20 and may be efficiently connected to connection pipes. Therefore, a layout of connection pipes may be simplified, and mountability and maintainability may be improved.

Furthermore, required number of separate portions realizing the layout of the connection pipes may be minimized, decreasing weight and cost, and improving productivity by reducing required assembly processes.

For convenience in explanation and accurate definition in the appended claims, the terms "upper", "lower", "inner", "outer", "up", "down", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A coolant supplying system comprising:
   a reservoir tank, an electrical component cooling circuit and a battery cooling circuit; and
   a coolant supplying module for supplying a coolant stored in the reservoir tank to the electrical component cooling circuit and the battery cooling circuit, wherein the coolant supplying module includes:
   a main body connected to the reservoir tank;
   at least one pump mounting portion formed at the main body to mount at least one pump included in the electrical component cooling circuit and the battery cooling circuit; and
   a valve mounting portion formed at the main body to mount a coolant valve included in the battery cooling circuit,
   wherein the main body further includes at least one barrier wall to distribute the coolant flowing into the main body,
   wherein the at least one pump mounting portion includes:
   a first pump mounting portion configured of mounting a first pump of the at least one pump included in the electrical component cooling circuit; and
   a second pump mounting portion configured of mounting a second pump of the at least one pump included the battery cooling circuit, and
   wherein the at least one barrier wall includes:
   a first barrier wall formed at a position in a vicinity of the first pump mounting portion and extending from a connection port formed in an upper portion of the main body toward the valve mounting portion in the main body; and
   a second barrier wall formed at a position facing the second pump mounting portion and extending from the valve mounting portion toward the connection port in the main body.

2. The coolant supplying system of claim 1, wherein a connection port is formed in an upper portion of the main body and the connection port is directly connected to the reservoir tank.

3. The coolant supplying system of claim 1, wherein the first pump mounting portion and the second pump mounting portion are formed perpendicular to each other.

4. The coolant supplying system of claim 1, further including a chiller connecting portion formed at the main body to connect a chiller for exchanging heat between the coolant of the reservoir tank and a refrigerant.

5. The coolant supplying system of claim 4, wherein the chiller connecting portion is formed at a position opposite to the first pump mounting portion.

6. The coolant supplying system of claim 4, wherein the at least one barrier wall further includes:
   a third barrier wall formed at a position apart from the chiller connecting portion toward the first pump mounting portion and extending from an internal lower portion of the main body toward an internal upper portion of the main body in the main body; and
   a fourth barrier wall formed at a position between the second barrier wall and the third barrier wall and extending from the internal upper portion toward the internal lower portion of the main body in the main body.

7. The coolant supplying system of claim 1, wherein, when the coolant flows from the valve mounting portion into the main body by an operational control of the coolant valve mounted at the valve mounting portion, the second barrier wall is configured of minimizing an amount of an inflow coolant flowing toward the second pump mounting portion while the second barrier wall act as a resistance in a coolant flow direction.

8. The coolant supplying system of claim 6, wherein the third barrier wall and the fourth barrier wall are configured to minimize an amount of coolant inflowing from the chiller connecting portion to flow toward the first pump mounting portion while the third and fourth barrier walls act as a resistance in a coolant flow direction.

9. The coolant supplying system of claim 4, wherein the valve mounting portion includes:
   an intake port separately formed by extending away from the main body;

a first outlet fluidically-communicating with an interior of the main body so that the valve mounting portion and the main body fluidically-communicate with each other; and a second outlet separately formed by extending away from the main body.

10. The coolant supplying system of claim 9, wherein the first outlet is disposed on a same axis with the intake port.

11. The coolant supplying system of claim 9, wherein, when separately cooling an electrical component mounted in the electrical component cooling circuit and a battery mounted in the battery cooling circuit, the coolant flowing from the reservoir tank into the main body flows to the first pump mounting portion by operation of the first pump, and is supplied to the electrical component cooling circuit, and the coolant flowing from the chiller connecting portion into the main body flows to the second pump mounting portion by operation of the second pump, and is supplied to the battery cooling circuit.

12. The coolant supplying system of claim 11, wherein, when separately cooling the electrical component and the battery, the first pump and the second pump rotate at a same rotation speed or the second pump rotates at a higher rotation speed than the first pump.

13. The coolant supplying system of claim 9, wherein, when integrally cooling an electrical component mounted in the electrical component cooling circuit and a battery mounted in the battery cooling circuit, the coolant flowing from the reservoir tank into the main body flows to the second pump mounting portion by operation of the second pump, and is supplied to the battery cooling circuit; and a part of coolant flowing from the reservoir tank into the main body and a coolant flowing from the valve mounting portion into the main body after passing through the battery cooling circuit flow to the first pump mounting portion by operation of the first pump, and is supplied to the electrical component cooling circuit.

14. The coolant supplying system of claim 1, wherein the valve mounting portion is formed at a lower portion of the main body.

15. The coolant supplying system of claim 4, wherein the main body, the pump mounting portion, the valve mounting portion, and the chiller connecting portion are integrally formed.

16. The coolant supplying system of claim 4, wherein the chiller connecting portion is formed to allow a coolant to flow into and be exhausted from the chiller.

17. The coolant supplying system of claim 4, wherein the chiller is directly mounted to the chiller connecting portion.

* * * * *

UNITED STATES PATENT AND TRADEMARK OFFICE
CERTIFICATE OF CORRECTION

| | | |
|---|---|---|
| PATENT NO. | : 11,576,284 B2 | Page 1 of 1 |
| APPLICATION NO. | : 16/851621 | |
| DATED | : February 7, 2023 | |
| INVENTOR(S) | : Yeon Ho Kim et al. | |

It is certified that error appears in the above-identified patent and that said Letters Patent is hereby corrected as shown below:

On the Title Page

Item (73) In the Assignee Information, please replace the following:
Morgan, Lewis & Bockius LLP, San Francisco, CA, US
With: Hyundai Motor Company, Seoul, KR

Signed and Sealed this
Second Day of May, 2023

Katherine Kelly Vidal
*Director of the United States Patent and Trademark Office*